(12) United States Patent
Bland et al.

(10) Patent No.: US 7,102,477 B2
(45) Date of Patent: Sep. 5, 2006

(54) MAGNETIC ELEMENT WITH SWITCHABLE DOMAIN STRUCTURE

(75) Inventors: James Anthony Charles Bland, Cambridge (GB); Bengt Johan Rothman, Fontainebleau (FR); Luis Lopez Diaz, Salamancha (ES); Mathias Kläui, Düsseldorf (DE)

(73) Assignee: Cambridge University Technical Services Ltd., Cambridge (GB)

( * ) Notice: Subject to any disclaimer, the term of this patent is extended or adjusted under 35 U.S.C. 154(b) by 344 days.

(21) Appl. No.: 10/344,138

(22) PCT Filed: Aug. 7, 2001

(86) PCT No.: PCT/GB01/03557

§ 371 (c)(1),
(2), (4) Date: Aug. 20, 2003

(87) PCT Pub. No.: WO02/13208

PCT Pub. Date: Feb. 14, 2002

(65) Prior Publication Data

US 2004/0021539 A1 Feb. 5, 2004

(30) Foreign Application Priority Data

Aug. 8, 2000 (GB) .............................. 0019506

(51) Int. Cl.
*H01F 7/02* (2006.01)

(52) U.S. Cl. ..................................................... 335/302
(58) Field of Classification Search ......... 335/302–306, 335/205–207
See application file for complete search history.

(56) References Cited

U.S. PATENT DOCUMENTS 5,019,796 A * 5/1991 Lee et al. .................... 335/302
5,576,679 A * 11/1996 Ohashi et al. ............... 335/306
2002/0113678 A1 * 8/2002 Creighton .................... 335/306

FOREIGN PATENT DOCUMENTS

WO 02/13208 2/2002

OTHER PUBLICATIONS

Jian–Gang Zhu et al., XP–000954081—Journal of Applied Physics; Symposium on Magnetic Technology for a Single Chip Computer; Ultrahigh Density Vertical Magnetoresistive Random Access Memory (Invited); vol. 87, pp. 6668–6673.

J. Wiggins et al.,—XP–000947861—Journal of Applied; vol. 87, No. 9, Phenomenological Magnetic Modeling of Au:Fe:Au nano–onions; pp. 5651–5653.

R.R. Kati et al.,—XP000410965; Center for Space Microelectronics Technology, Jet Propulsion Laboratory, California Institute of Technology, "Partially Grooved Domain Stabilization Structures For Vertical Bloch Line Memory." P. DE–05.

(Continued)

*Primary Examiner*—Elvin Enad
*Assistant Examiner*—Bernard Rojas
(74) *Attorney, Agent, or Firm*—Dykema Gossett PLLC

(57) ABSTRACT

A magnetic element comprises a closed loop of ferromagnetic material having an even number of magnetic domains of opposite sense. The magnetisation within the domains is in a circumferential direction, and the domains have leading and trailing walls extending from the inside to the outside of the loop. The magnetic element has a geometry such that there are at least two stable equilibrium domain configurations in which the domain walls are confined in predetermined portions of the loop and wherein the element is switchable between the stable configurations upon the application of a external magnetic field.

7 Claims, 5 Drawing Sheets

OTHER PUBLICATIONS

M. M. Miller et al., Naval Laboratory Applied Physics Letters; Detection of a Micron–Sized Magnetic Sphere Using a Ring–Shaped Anisotropic Magnetoresistance–based Sensor: A Model for a Magnetoresistance–based Biosensor; vol. 81, No. 12; pp. 2211–2213.

S. Tomino, et al.,—Department of Material Science and Engineering; Journal of Magnetism and Magnetic Materials 212 (2000) 69–74. Ferromagnetic dot formation in nonmagnetic amorphous FeZr films by non–contact atomic force microscope.

* cited by examiner

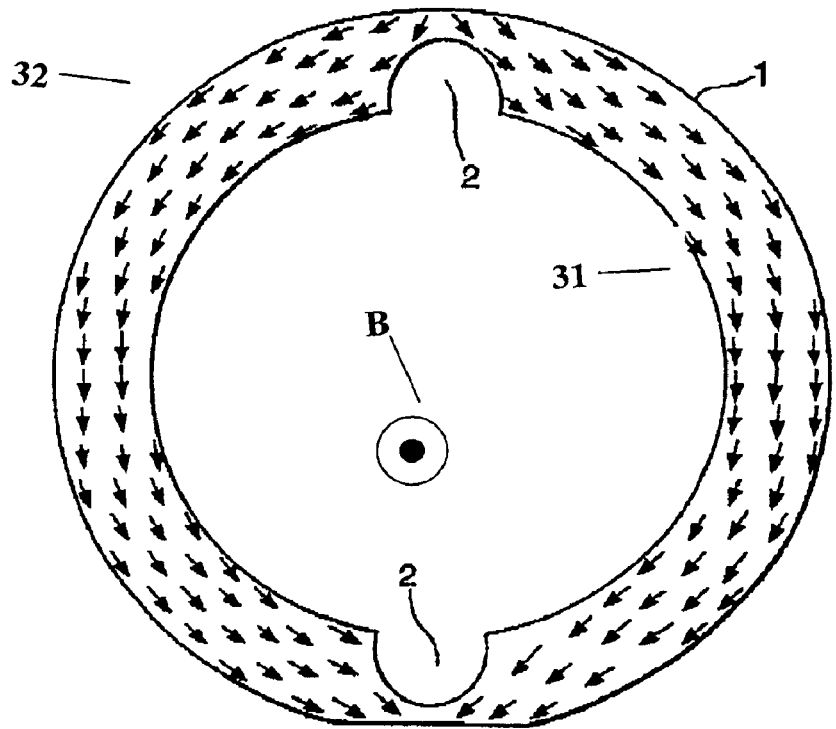
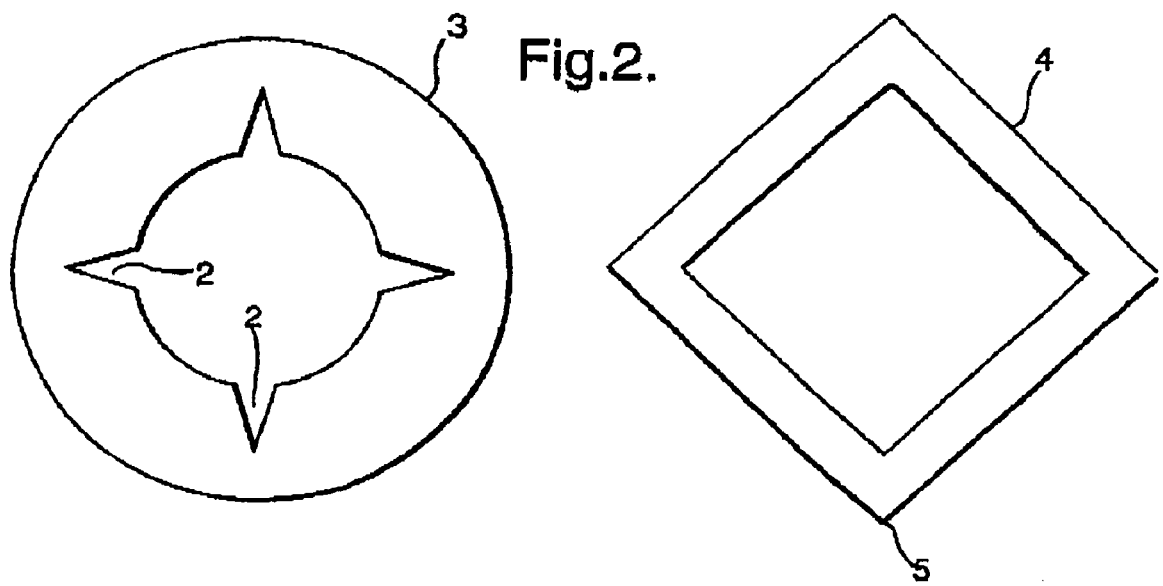

MAGNETIC ELEMENT WITH SWITCHABLE DOMAIN STRUCTURE

BACKGROUND OF THE INVENTION

The present invention relates to magnetic elements with stable but switchable domain structures. These elements are useful in array Magnetic Random Access Memories (MRAM) and in hard disk read/write heads.

The use of magnetic structures in magnetic data storage has intensified during the last 10 years. The main application is found in the read head in hard disk drives, which are based on Anisotropic Magneto Resistive (AMR) thin films and on more complex systems utilising Giant Magneto Resistive (GMR), or Tunnel Magneto Resistive (TMR), multilayers. Another newer application is the use of small magnetic elements to store the data in Random Access Memories. The main qualities needed for these applications, apart from a high magneto resistance, are well defined and reproducible magnetic states having a predictable response to an applied magnetic field. In addition, with the increase in speed in microelectronics, the required switching speed between different magnetic states is approaching the GHz range.

The choice of geometry and the equilibrium state of the magnetic element are crucial in achieving this performance. All existing devices in use today are topologically simply connected i.e. disc shaped, square, rectangular or even eye shaped. One problem with these structures is edge effects, defining a multitude of different and complex states with similar energy. This leads to complex switching behaviour. The multitude of states in these structures makes them very sensitive to imperfections, both macroscopic defects, i.e. shape variation, and atomic scale defects resulting from the pattering. It has been shown by Zhu et al. "Journal of Applied Physics," page 6668–6673, Volume 87, Number 9., that a slight variation in the shape of a rectangular element will result in 100% change in the coercive field.

To obtain a better defined state, Zhu et al. proposed to use a connected element in the shape of a ring, for which the vortex state is very stable. Information can be stored as the two opposite vortex states. The switching of these elements is, however, complicated and the magnetic elements pass through a complex intermediate state with a radial magnetisation. This complexity sets a limit on the size of usable structures and the switching speed.

There is therefore a need for non-volatile memory arrays and magnetic read/write heads for devices which have greater speed, reliability and cost effectiveness.

SUMMARY OF THE INVENTION

A magnetic element according to the present invention comprises a closed loop of ferromagnetic material having an even number of magnetic domains of opposite sense, the magnetisation within the domains being in a circumferential direction, the domains having leading and trailing walls extending from the inside to the outside of the loop, wherein the magnetic element has a geometry such that there are at least two stable equilibrium domain configurations in which the domain walls are confined in predetermined portions of the loop and wherein the element is switchable between the stable configurations upon the application of a external magnetic field.

The present invention offers well controlled switching without complex intermediate states. It also allows nanometre scale devices and no interaction between loops in close proximity, allowing a high density of individual elements and very high speed switching.

Preferably the loop is substantially circular. Preferably there are notches in the loop of ferromagnetic material, the domain walls being confined in a stable equilibrium at positions corresponding to the notches. Preferably the loop has two or four notches.

According to another aspect of the present invention two magnetic elements of the above type are placed one above the other, separated by a spacer to form a Giant Magneto Resistive (GMR) and Tunnel Magneto Resistance (TMR) device. With such a device, by altering the domain configuration of one element relative to the other, data can be stored and read by a measurement of resistance.

According to a further aspect of the present invention the position of the wall could be sensed by measuring the domain wall induced magneto resistance (DMR).

According to a further aspect of the present invention a read head or sensor comprises a first layer forming a magnetic element as described above, and a second layer forming by a magnetic element having a stable domain, wherein in use the resistance of the device can be measured to ascertain the alignment of domains of the first layer relative to the domain of the second layer, as a field sensor.

According to yet another aspect of the present invention a write head comprises a magnetic element as described above, wherein a portion of the magnetic element containing a domain wall is arranged to pass, in use, near a magnetic storage medium such that the stray field generated at the domain walls aligns magnetic domains in the magnetic storage medium.

According to a further aspect of the present invention, the special state can be used to prepare the loop in a selected vortex state.

BRIEF DESCRIPTION OF THE DRAWINGS

Examples of the present invention will now be described with reference to the accompanying drawings, in which:

FIG. 1 shows a ferromagnetic loop according to the present invention with a preferred geometry in which the domains are in the same direction;

FIG. 2 shows examples of other suitable geometries for a ferromagnetic loop according to the present invention;

DESCRIPTION OF THE INVENTION

Figure 1A:
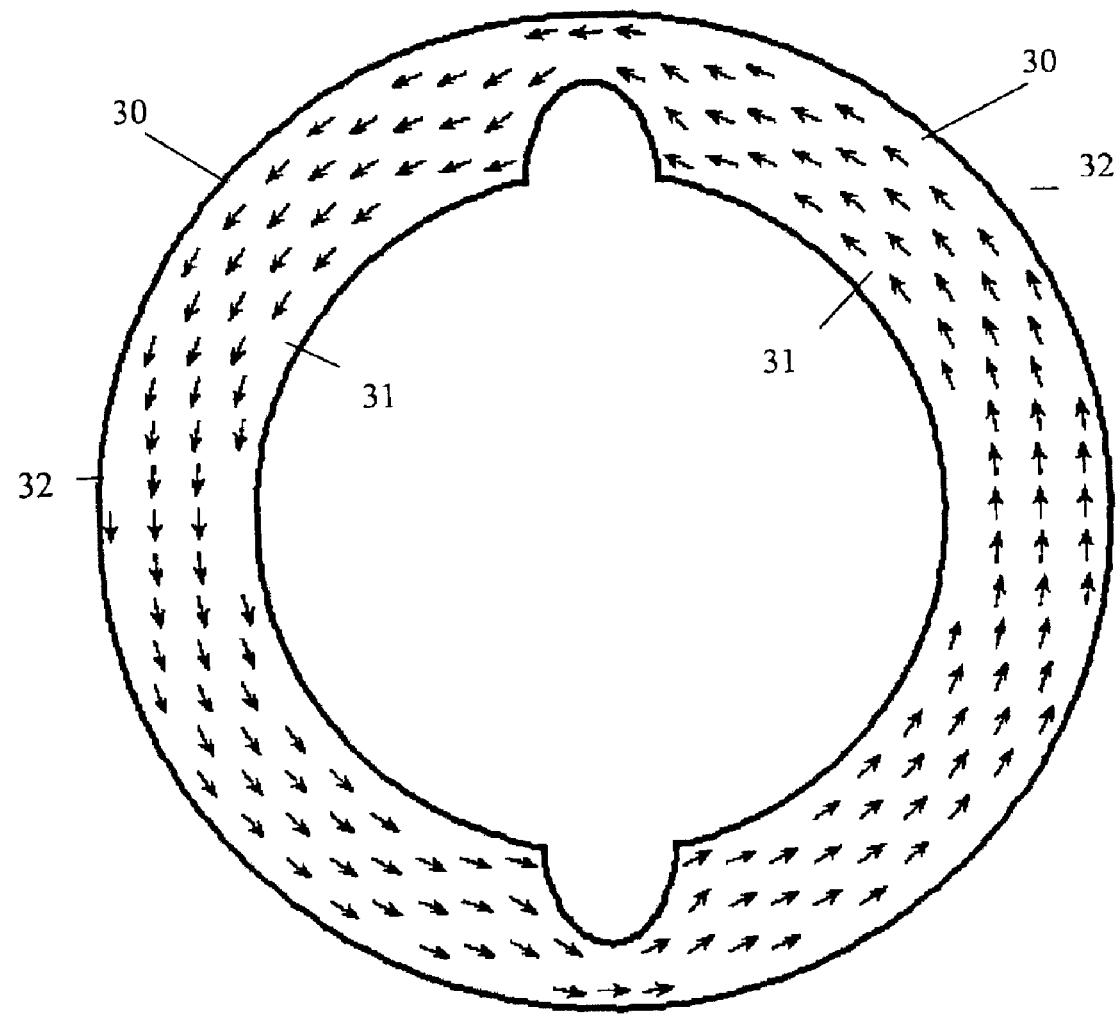
FIG. 1A shows the arrangement of FIG. 1, wherein one domain has been switched so that they are in opposite directions.

FIG. 1 shows a ferromagnetic loop 1 according to a first example of the present invention. The loop 1 is substantially circular and has two diametrically opposed notches 2 cut into the inside face of the loop. The diameter of the loop can be the order of a few nanometres. The direction of the magnetic field lines are in the same direction shown by the arrows. In FIG. 1A, the arrows are in opposite directions. The loop as shown comprises two equally sized magnetic domains 30A, 30B separated by two domain walls. The domain walls are located between and include leading edges 31 and trailing edges 32, the narrow portions of the loop by the notches 2. This domain configuration, hereinafter referred to as an "Onion State", is stable as it is energetically favorable for the loop as a whole. The two dominant energy considerations which determine the stable domain configurations of the loop are the energy associated with the formation of a magnetic domain wall and the energy contained in external magnetic fields B generated by the loop. In FIG. 1, the field B is out of the page as illustrated by an encircled "dot". The FIG. 1A, the field B be into the page and is shown as an encircled "x". For a stable configuration the size and number of domain walls is minimised and the external field is minimised. In the loop shown in FIG. 1 the size of the domain walls are minimised as they are located in the narrowest portions of the loop. The external field is minimised as the field lines are aligned with the edge of the loop, the only stray external magnetic field is generated at the domain walls. The loop does not enter the very lowest energy state, a vortex state as shown in FIG. 7, as energy would be required to form any intermediate state.

As can be easily appreciated, the loop shown in FIG. 1 would be equally stable if the domains were aligned 180E from the orientation shown, to form another "Onion State". The loop can be switched between the two Onion States by the application of a pulse of magnetic flux to the domain walls. The applied magnetic flux causes the domain walls to propagate around the loop in both directions until another stable configuration is reached. In this way the alignment of the domains is reversed and the other Onion State is achieved. The use of domain wall propagation gives rise to fast and simple switching with no complex intermediate states. The applied switching magnetic flux must be sufficient to lift the loop out of the energy minimum of the Onion State but not so strong as to cause the domain walls to overshoot one another and continue to propagate around the loop. If the applied magnetic flux is too strong the loop will eventually reach a stable Onion state but the speed of switching will be reduced as the domain walls will have travelled further. Furthermore the loop may return to the same Onion State as it started in and thus the reliability of the switching is reduced.

FIG. 2 shows other possible geometries for a ferromagnetic loop according to the present invention. FIG. 2 shows a circular loop 3 with four notches 2. This gives rise to four possible "Onion States". Again the position of the domain walls is stable when located at narrow portions of the loop. The four notch configuration gives quicker and simpler switching than the two notch version. An advantage of the present invention is that switching speed will increase with a reduction in size, as the switching time is proportional to the distance that the domain wall has to travel.

FIG. 2 shows a square geometry for the loop 4. In this embodiment the domain walls are stable at the corners 5 of the square. The energy required to form the domain walls at the corners is less than that in the arms of the loop for the following reason. To minimise the external field the magnetic field within the loop aligns itself with the sides of the loop. Therefore at the corners of the loop the domain wall need only incorporate a 90E rotation of the magnetic field whereas in the arms the domain walls would have to incorporate a 180E rotation. A 90E rotation requires less energy than a 180E rotation so the most stable configuration has domain walls located at the corners of the loop. The domain configuration can be switched by the application of a pulse of magnetic flux to the corners of the loop causing domain wall propagation around the loop.

Ferromagnetic loops according to the present invention can be made from NiFe using conventional photolithography.

Figure 3:
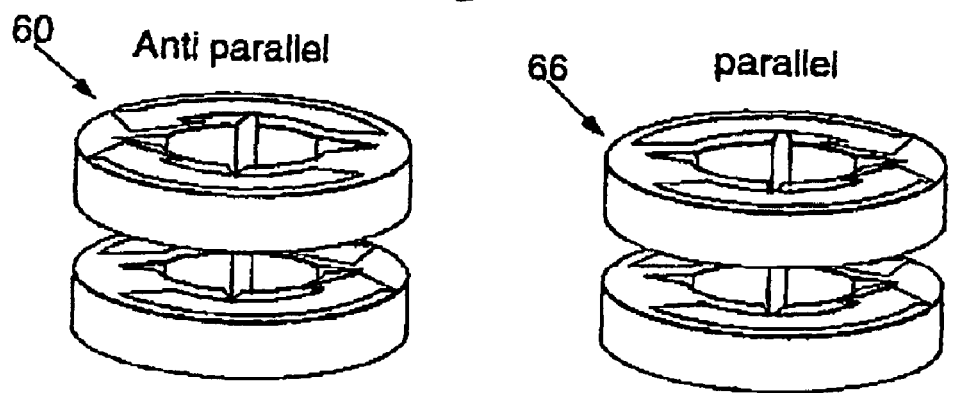
FIG. 3 illustrates how ferromagnetic loops according to the present invention can be arranged for data storage.

The magnetic loops of the present invention are useful for a number of applications. FIG. 3 shows how magnetic loops can be arranged for the purpose of data storage. The arrangement is that of a classic GMR or TMR device. Two circular loops, having two notches, in the Onion State as shown in FIG. 1, are stacked one on top of the other. The domains of one loop can be either parallel 6b or anti parallel 6a to the domains of the other loop. By fixing the Onion State of one loop and switching the Onion State of the other the relative domain alignment of the loops can be controlled. One bit of data can be stored in this way with a 1 corresponding to a parallel arrangement and a 0 corresponding to an anti parallel arrangement, or vice versa. The bit of data can be read by measuring the resistance across the two loops as the resistance of the parallel configuration is less than the resistance of the anti parallel configuration. The circular nature of the loops means that they produce very little stray magnetic field. This means that a large number of these devices can be placed in close proximity to each other without interfering with their function.

Figure 4:
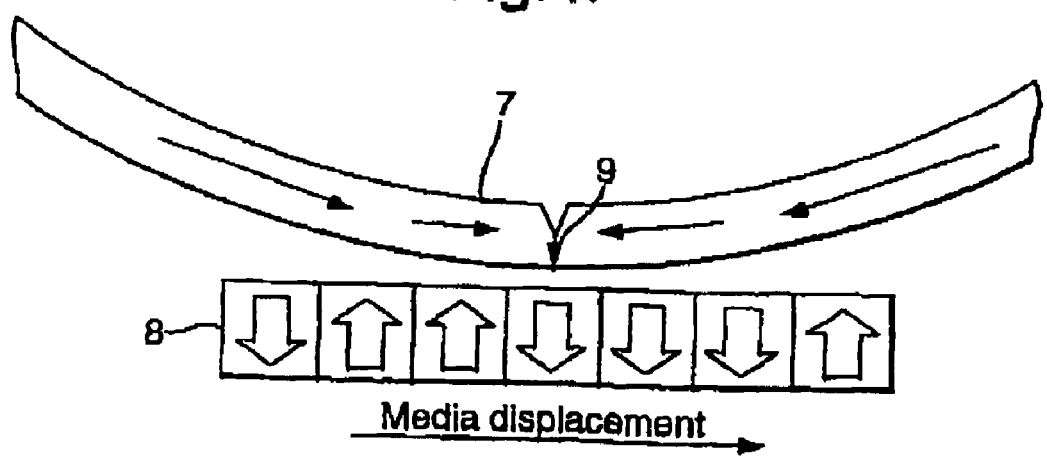
FIG. 4 shows a write head incorporating a ferromagnetic loop according to the present invention.

However a ferromagnetic loop in the Onion State will generate a small stray magnetic field at the domain walls and this can be utilised in a magnetic write head. FIG. 4 shows a magnetic write head 7 utilising a ferromagnetic loop according to the present invention. The stray magnetic field will be perpendicular to the loop but the direction of the field will depend on the particular Onion State of the loop. The direction of the stray field is switched when the Onion State is switched. A magnetic data storage medium 8 can be passed close to a domain wall 9 in the loop and by switching between opposing Onion States of the loop the stray field can "write" opposing bits of magnetic data on the data storage medium. For perpendicular recording of this nature only one ferromagnetic loop is needed. The use of the Onion state for this purpose has the advantage of speed and the fact that a very small area on the magnetic data storage medium, i.e. the thickness of the loop X the width of the domain wall, typically 10 nm×10 nm, is influenced at any one time. The switching of the Onion State can be effected by impedance matched strip lines or by a bigger electromagnet such as those used for write heads at present.

Figure 5:
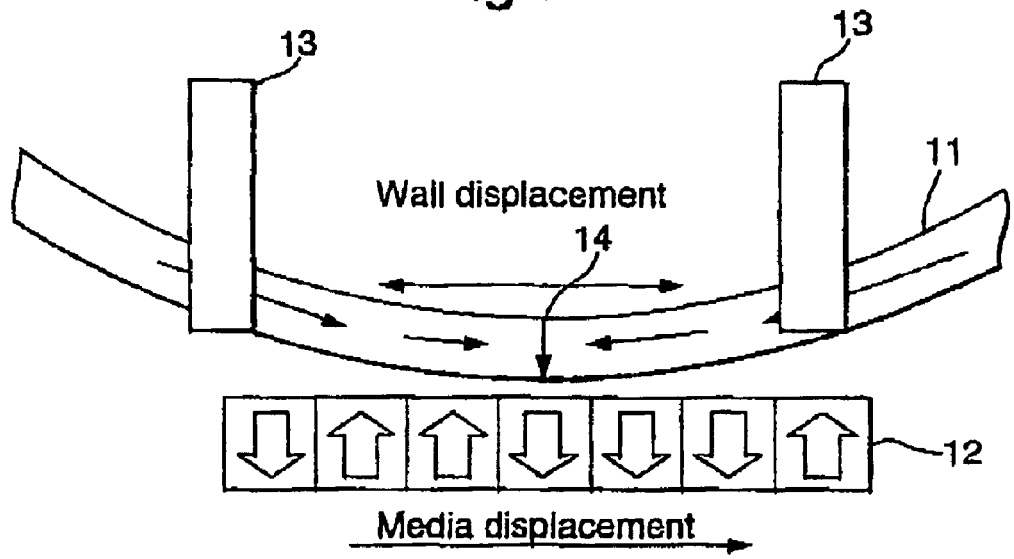
FIG. 5 shows a read head incorporating a ferromagnetic loop according to the present invention.

FIG. 5 shows a cross section of a read head using a ferromagnetic loop according to the present invention. A GMR or TMR layer structure similar to that shown in FIG. 3 is shown with only one loop 11 visible. A first loop is in an Onion state and a second loop is in a fixed domain configuration, either an Onion State pinned 90E from the first loop or in a vortex state. One domain wall of the first loop is weakly confined in a shallow energy minimum at a particular point in the loop. The domain wall is in a smooth potential making its position sensitive to applied magnetic fields. In the arrangement shown a magnetic data storage medium 12 is passed close to the domain wall 14 and the stray field from the medium causes the domain wall 14 to propagate in either direction backwards and forwards. A pair of electrical contacts 13 are connected across the read head to continuously measure the resistance across the two layers to give a read out of the change of magnetic state in the read head and hence in the magnetic data storage medium. Similar to the write head described above, a read head using a ferromagnetic loop according to the present invention acts on a very small area and so can read very high density data storage media.

Figure 6:
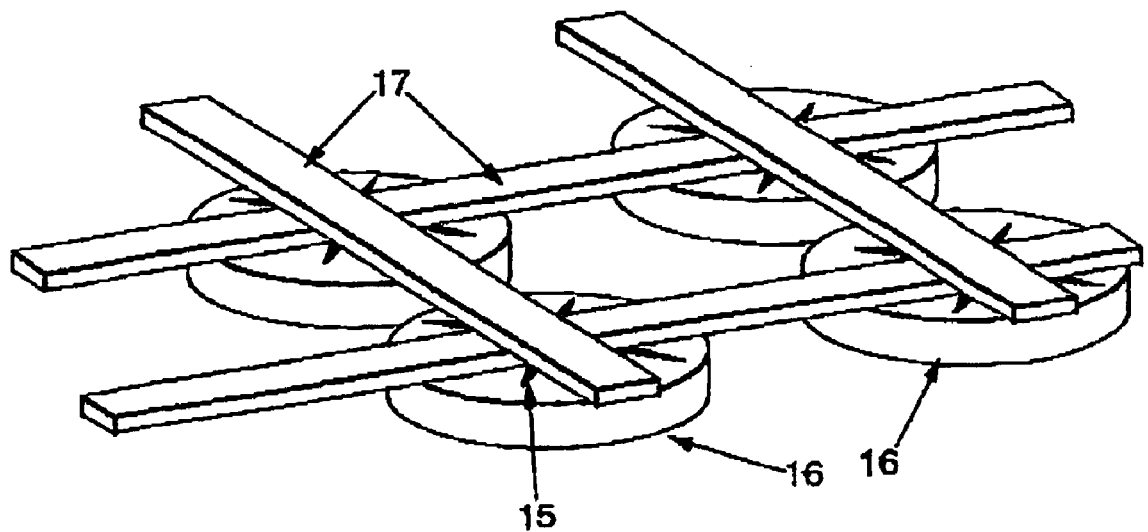
FIG. 6 shows a data storage arrangement using four-notched ferromagnetic loops according to the present invention.
Figure 7A:
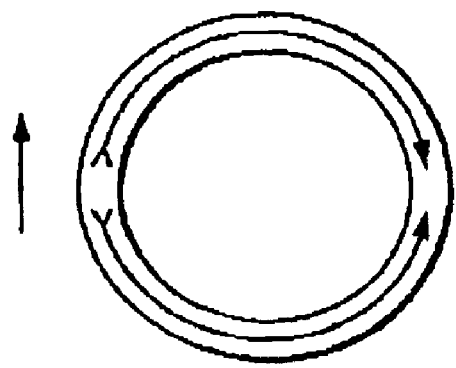
FIG. 7 illustrates switching from an Aonion state@ to a Vortex state.
Figure 7B:
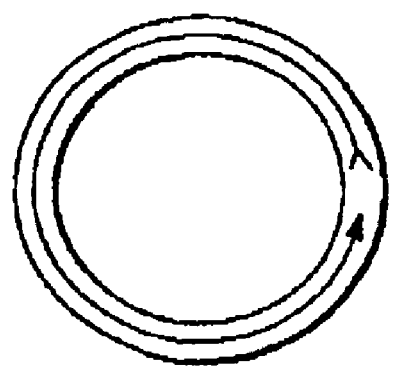
Figure 7C:
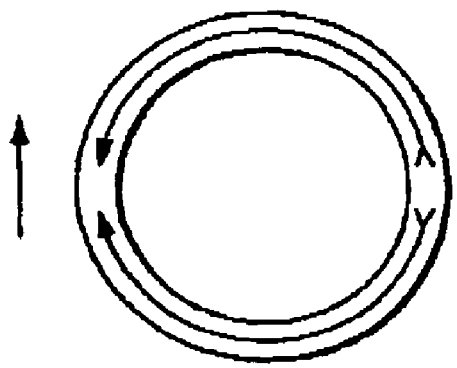
Figure 7D:
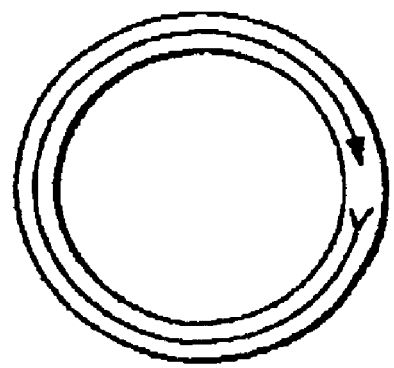

FIG. 6 shows part of an array of four-notched circular loops 16 used for data storage. The four-notched loops 16 can be in any one of four Onion States. Depending upon the Onion state that the loop is in particular notched portions 15 of the loop either will or will not contain a domain wall. The presence of a domain wall can be ascertained by a measurement of the Magneto Resistance (MR). Therefore the particular Onion State that the loop is in, which corresponds to one bit of data, can be determined from resistance measurements. DMR arises owing to an effect akin to GMR. The DMR will be greater the smaller the region over which the rotation of the magnetic field within the loop occurs. In FIG. 6 the write lines are arranged at 45E to the notches. The state of a particular loop in the array can be switched by applying a current in two perpendicular leads 17 simultaneously.

FIG. 7 illustrates how the onion state in ferromagnetic loops according to the present invention can be used as an intermediate state to control switching between the vortex states. The vortex state is the most stable state for a ferromagnetic loop. However switching between the two vortex states has in the past required complex intermediate states. Ferromagnetic loops in the onion state, (a) or (c), can be switched into a vortex state, (b) and (d) respectively, by the application of a strong uniaxial magnetic field (−500 Oe) antiparallel to the onion state. At stronger fields the loop will switch into the opposite onion state. Switching into the vortex state occurs when an asymmetry is present in the loop and one wall is more pinned than the other. The switching occurs by movement of the free wall until it meets the other pinned wall and a vortex state is formed. For a given asymmetry it is always the same wall that moves in the same direction. Therefore, as illustrated in FIG. 7, the different onion states will always switch into the same different vortex states in a controlled way. To switch from one vortex state to the other the loop is first put into the desired onion state by the application of a strong magnetic field. The field is then reduced and reversed to attain the desired vortex state. This mechanism is advantageous over prior switching mechanisms between vortex states as it will only need two write lines, as shown in FIG. 6, and is therefore be easier to integrate. Switching between the onion state and the vortex state can also be utilised in an MRAM. Micromagnetic simulations further extend the performance of narrow rings as memory cells in MRAM devices in terms of scalability and switching speed. By introducing two artificial notches at the outer surface of the rings in order to control accurately the depinning fields of the domain walls, well defined states and switching by domain wall motion can be achieved for ring diamaters down 180 nm. In order to speed up the switching process, two different approaches are possible. In the first one, a field pulse is applied in the plane of the ring and perpendicular to the walls. In this case the walls are depinned effectively and magnetization reversal can be achieved in a few ns. In the second approach, the field is applied perpendicular to the plane of the ring. This field drives the system out of equilibrium and precessional motion causes the walls move around the ring. With this approach, switching times can be lowered down to 220 ps.

What is claimed is:

1. A magnetic element comprises a closed loop of ferromagnetic material having an even number of magnetic domains of opposite sense, the magnetisation within the domains being in a circumferential direction, the domains having leading and trailing walls extending from the inside to the outside of the loop, wherein the magnetic element has a geometry such that there are at least two stable equilibrium domain configurations in which the domain walls are confined in predetermined portions of the loop and wherein the element is switchable between the stable configurations upon the application of a external magnetic field.

2. The element of claim 1, wherein the loop is substantially circular.

3. The element of claim 1 or claim 2, wherein there are notches in the loop of ferromagnetic material, the domain walls being confined in a stable equilibrium at positions corresponding to the notches.

4. The element of claim 3, wherein the loop has two or four notches.

5. A Giant Magnetic Resistive (GMR) and Tunnel Magnetic Resistance (TMR) device comprising two magnetic elements according to any of the preceding claims placed one above the other and separated by a spacer.

6. A sensor comprising a first layer forming a magnetic element according to any of claims 1 to 4, and a second layer forming by a magnetic element having a stable domain, wherein in use the resistance of the device can be measured to ascertain the alignment of domains of the first layer relative to the domain of the second layer, as a field sensor.

7. A write head comprising a magnetic element according to any of claims 1 to 4, wherein a portion of the magnetic element containing a domain wall is arranged to pass, in use, near a magnetic storage medium such that the stray field generated at the domain walls aligns magnetic domains in the magnetic storage medium.

\* \* \* \* \*